United States Patent [19]

Moreau et al.

[11] 3,934,057

[45] Jan. 20, 1976

[54] HIGH SENSITIVITY POSITIVE RESIST LAYERS AND MASK FORMATION PROCESS

[75] Inventors: Wayne M. Moreau, Wappinger Falls; Chiu H. Ting, Hopewell Junction, both of N.Y.

[73] Assignee: International Business Machines Corporation, Armonk, N.Y.

[22] Filed: Dec. 19, 1973

[21] Appl. No.: 426,403

[52] U.S. Cl. ............... 427/43; 96/35.1; 96/36.2; 204/159.14; 427/273; 427/352; 428/520; 428/901
[51] Int. Cl.² .................................. B05D 3/06
[58] Field of Search........ 117/93.31, 8, 161 UC, 72, 117/6, 8.5, 75, 76 F; 96/35.1, 36.2, 68, 115 R; 204/159.14

[56] References Cited
UNITED STATES PATENTS

| | | |
|---|---|---|
| 2,964,401 | 12/1960 | Plambeck ..................... 96/35.1 |
| 2,993,789 | 7/1961 | Crawford ..................... 96/35.1 |
| 3,535,137 | 10/1970 | Haller et al. ................ 117/93.31 |
| 3,799,777 | 3/1974 | O'Keefe ....................... 96/36.2 |

*Primary Examiner*—John H. Newsome
*Attorney, Agent, or Firm*—David M. Bunnell

[57] ABSTRACT

A high sensitivity resist layer structure for high energy radiation exposure is formed by coating plural layers of radiation degradable polymers on a substrate which layers are successively slower dissolving in the resist developer. Upon exposure and solvent development, a resist edge profile is obtained which is particularly useful for metal lift-off.

17 Claims, 12 Drawing Figures

HIGH SENSITIVITY POSITIVE RESIST LAYERS AND MASK FORMATION PROCESS

BACKGROUND OF THE INVENTION

This invention relates generally to resist layer structures and more particularly to high sensitivity positive resist layers useful in high energy radiation exposure processes.

The formation of positive resist masks from layers of radiation degradable polymers is described, for example, by Haller and Hatzakis in U.S. Pat. No. 3,535,137. In this process a radiation degradable polymer layer is coated on a substrate and is subjected to patternwise exposure to high energy radiation such as, for example, x-rays, nuclear radiation, and electrons. The irradiated regions of the polymer suffer a decrease in molecular weight and thereby become more soluble. A developer is then used to preferentially remove the irradiated portions of the layer. The substrate can then be subjected to an additive or subtractive process such as metallization or etching with the remaining portions of the resist layer protecting the substrate from the processing.

Although it is possible to employ developers which attack only the exposed portions of the resist and leave the unexposed portions almost intact, it has been found that much higher resist sensitivity can be obtained if a solvent is employed which attacks both the exposed and unexposed portions of the resist but preferentially attacks the exposed portion. The resist layers are applied in sufficient thicknesses so that the unexposed portions of the resist layer retains a sufficient thickness for further processing.

The sensitivity of the resist layer can be defined by the ratio $S/S_0$ where S is the solubility rate of exposed resist for a given exposure dosage and $S_0$ is the solubility rate in angstroms per minute for the unexposed resist. Generally a $S/S_0$ ratio of at least about 2.0 is required for most processes so that a sufficient unexposed resist layer thickness remains after development. One way to increase the ratio is to increase the dosage. However, this has the disadvantage of slowing down the exposure process particularly when the exposure is accomplished using a scanning beam of radiation. For example, in the formation of integrated circuits or exposure masks, one process which is employed is a liftoff process in which a patterned relief layer of resist is first formed on a substrate. A layer of material, such as a metal for integrated circuit conductor lines or an opaque masking material for mask fabrication is coated over the resist layer and the exposed portions of the substrate. The resist layer is then stripped off and takes with it the overlying material to leave only the pattern of material in direct contact with the substrate. Such a process is described, for example, by Hatzakis, Electron Resists For Micro Circuit And Mask Production, Journal of the Electro Chemical Society, Volume 116, No. 7, pages 1033 to 1037, July 1969 and by Hatzakis and Broers, Record of the Eleventh Symposium on Electron, Ion and Laser Beam Technology, pages 337 to 344. The described process takes advantage of the natural undercutting of the resist during high energy exposure such that the developed resist pattern is wider at the bottom then the top. This provile aids in forming a discontinuity between the portions of material which are on the substrate surface and the portions which cover the resist. This dicontinuity is needed in order to permit the resist stripping solution to attack the unexposed resist and remove it along with the overlying material. The resist layer thickness required for a metal lift-off process, for example, must be in the ratio of a minimum of about 1.5/1 resist thickness to metal thickness to avoid bridging of metal between the portion on the substrate and the portion covering the resist. Therefore, the loss of unexposed resist during development must be limited. In other words, the solubility ratio $S/S_0$ must be maximized. This can be done by increasing exposure times to create a greater molecular weight differential between the exposed and unexposed resist. However, this has the effect of slowing down the exposure process.

Another factor involved in the use of high energy radiation to exposed resist layers is the fact that there are certain advantages to the use of, for example, beams of increasing energy, for example, 10 to 50 kilovolts (KV). This has the advantage of decreasing writing times for a resist because higher amps/per square centimeter can be produced by the electron gun and the higher energy beams also provide more back scatter electron signal for better registration and detection. However, it has been found that for any given resist thickness employed, the higher energy beams produce less electron scattering and undercutting of the resist such that excessive exposure times would be required to obtain the desired undercut profile by exposure alone.

SUMMARY OF THE INVENTION

A resist layer structure has now been found which has increased sensitivity in which will achieve suitable profiles for lift-off processing.

In accordance with this invention a high sensitivity resist layer structure is provided which comprises plural layers of resist coated on a substrate. Each resist layer includes a radiation degradable organic polymer and each successive resist layer has a lower dissolution rate in the resist developer than the resist layer which it overlies.

A resist mask is formed by patternwise exposing the resist layer structure with high energy radiation and then developing to remove the exposed portions of the layers to uncover the substrate by treating the layers with a solvent which preferentially dissolves the exposed portions of the layer.

In another aspect of the invention, a layer of material is formed over the resist mask and substrate such that the portion of the layer in contact with the substrate is disconnected from the portions of the layer covering the resist. The unexposed resist layer and overlying layer of material are then removed by treatment with a solvent stripper for the resist so as to leave only that portion of the layer which is formed directly on the substrate.

The foregoing and other objects, features and advantages of the invention will be apparent from the following more particular description of preferred embodiments of the invention as illustrated in the accompanying drawings.

DETAILED DESCRIPTION

The resists useful in the practice of the invention are those which are degraded under high energy radiation at dosage levels above about $1 \times 10^{-8}$ coulombs per square centimeter and which are conventionally employed in positive high energy exposure resist systems. Such resists include, for example, vinyl type polymers such as the lower alkyl esters of methacrylate, n-butylmethacrylate and t-butylmethacrylate, diazo sensitized novolac resins such as described in U.S. Pat. No. 3,201,239.

The plural layers of resist can be made up of the same polymer of different polymers so long as the underlayers are faster dissolving in developer solution than the overlying layer. Depending upon the final resist relief profile which is desired, two or more layers can be employed with slow dissolving layers over faster dissolving layers.

The solubility rate differences of the layers can be established by using one or a combination of known chemical and structural differences in the resist layer compositions. A convenient way of achieving the required solubility rate differences is by varying the molecular weight of the polymer in each layer since lower average molecular weight materials of a family of polymers are faster dissolving. Another way of establishing the required solubility rate differences is by isomerism such as the tacticity of the polymers, with polymers of the same molecular weight but different spacial arrangement of monomer units having different solubility rates. Co-polymers with varying ratios of monomers can also be employed as well as layers of polymers having functional groups of varying polarity.

Where molecular weight differences are relied upon, the ranges of molecular weights generally found to be useful are for the underlayer an Mn of 5,000–100,000 (where Mn is the number average molecular weight) and for the overlayer an Mn of 20,000–10,000,000. Because any polymer material is a mixture of polymer chains of varying length, the solubility rate differences can be enhanced if polymer layers each having a relatively narrow molecular weight range, or dispersivity Mw/Mn, are selected (where Mw is the weight average molecular weight). Generally the dispersivity will range from 1.5–4.0 with about 1.5 being preferred. Dispersivities of less than 2.0 at high molecular weights (above about an Mn of 300,000) may result in film cracking and, therefore, should be avoided.

Figure 1:
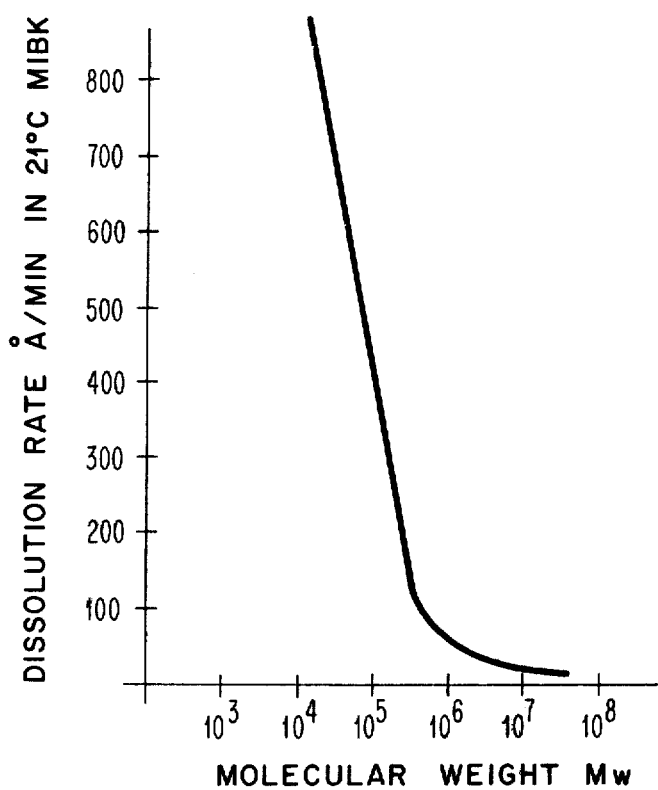
FIG. 1 is a graph showing a plot of the dissolution rate of polymethyl methacrylate verses its molecular weight.

The choice of molecular weight differences between adjacent layers depends upon the particular resist being employed and the final profile and thickness required. This can be determined by those skilled in the art based on the above and further teachings of the examples. An example of solubility rate verses molecular weight for polymethyl methacrylate is shown graphically in FIG. 1. It can be seen that large solubility rate differences are obtained with molecular weights ranging from about 5,000 to 500,000 and then the curve levels off.

The effect of tacticity on the solubility rate of three different samples of A, B and C of polymethyl methacrylate in methyl isobutyl ketone at 21°C is shown in Table I.

TABLE I

| | Tracticity in % | | | Molecular Weight $\times 10^3$ | | So |
|---|---|---|---|---|---|---|
| | Isotatic | Heterotactic | Syndiotactic | Mw | n | A/min |
| A. | 7.7 | 41.7 | 52.6 | 80 | 40 | 600 |
| B. | 90.5 | 8.5 | 1.0 | 62 | 31 | 2600 |
| C. | 3.8 | 26.1 | 70.2 | 51 | 29 | 1000 |

It can be seen from Table I that enhanced sensitivity can be achieved by coating layers of similar molecular weight but different tacticity because of the solubility rate differences which exist because of tacticity.

The layer thicknesses of resist which are employed are generally in the range conventionally employed for resist etching and lift-off processing. The resist layers should be thick enough so that the final thickness of resist will avoid excessive pinholes or be sufficient to give the required thickness for a lift-off process. Generally the underlayer thickness will range from about 1,000A to 100,000A. The top layer thickness should be thick enough, based on its solubility rate in the developer so that some thickness of the upper layer will be retained at least until the underlayers are developed through to the substrate. Generally top layer thicknesses will range from about 200A to 20,000A.

The application of the resist layers can be by conventional means such as by spin or dip coating from solvent solutions. The underlayers are preferably prebaked at a temperature above the glass transistion temperature but below the decomposition point to avoid dissolution of the film when the top layers are spin coated.

The exposure is by high energy radiation such as x-ray, nuclear radiation, electron beam and so forth. A preferred method of exposure is by employing an electron beam of from about 3 to 50 KV at exposure times which provide dosages of from about 3 to 30 microcoulombs per square centimeter depending upon the sensitivity of the particular resist structure employed.

Development is by a developer which preferentially dissolves the exposed portions of the layer. For example, an organic solvent or mixture in the case of acrylate polymers and an alkaline developer in the case of the diazo sensitized phenol-formaldehyde novolac resin base resists.

Following development the resist layers can be postbaked at temperatures to improve adhesion and dry the film without melting or distorting the image, for example, at temperatures of from about 100° to 150°C.

The following examples illustrate the sensitivity increase obtainable by the process of the invention when compared to the prior art single layer process. Besides increasing the speeds obtainable, the invention also achieves proper resist profile for the metal lift-off process.

EXAMPLE 1

Figure 2:
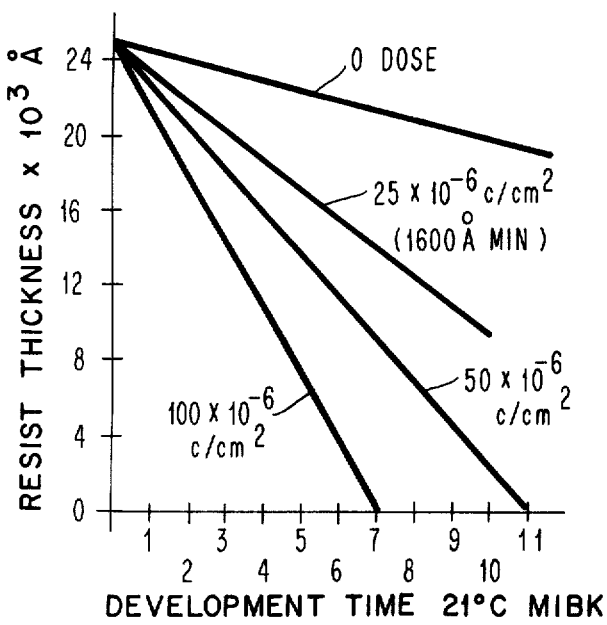
FIG. 2 are plots of resist thickness versus development time showing the dissolution rate for polymethyl methacrylate for various exposure dosages.
Figure 3:
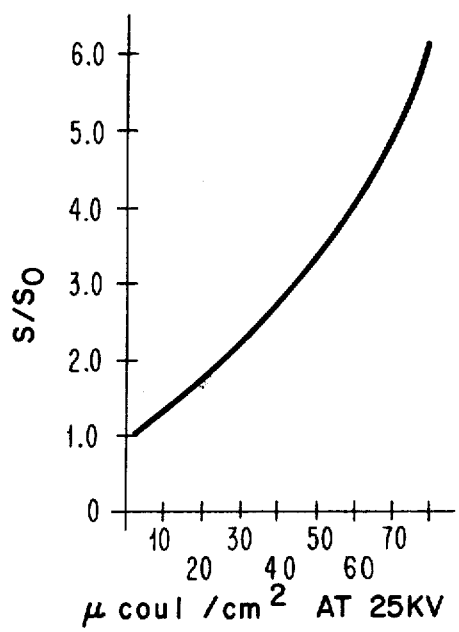
FIG. 3 is a sensitivity curve for polymethyl methacrylate.
Figure 4A:
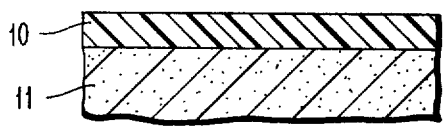
FIGS. 4A through D are cross sectional views with parts broken away illustrating a single layer resist process of the prior art.
Figure 5A:
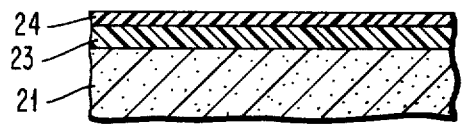
FIGS. 5A through E are cross sectional views with parts broken away of an embodiment of the multilayer process of the invention.
Figure 4B:
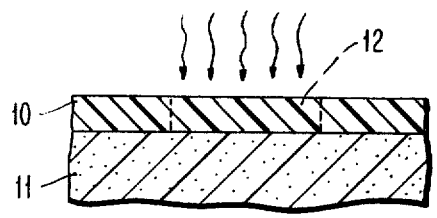
Figure 4C:
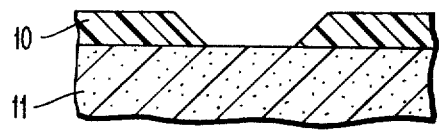
Figure 5C:
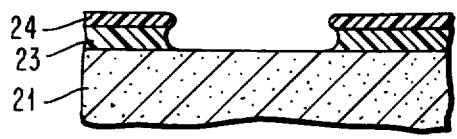
Figure 4D:
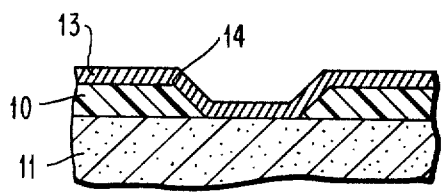

This example illustrates the sensitivity and profile of a single layer structure. A 25,000A thick layer of polymethyl methacrylate (Mw = 82,400; Mn = 41,560) was spun cast from an 18% solution by weight of the polymer in chlorobenzene onto several silicon wafers to produce as illustrated in FIG. 4A a resist film 10 on silicon wafer 11. The resist film was prebaked at a temperature of about 160°C in air for about one hour. Each sample was exposed with dosages ranging from 1 × 10⁻⁶ coulombs per square centimeter to 300 × 10⁻⁶ coulombs per square centimeter using a 1 micron diameter electron beam at an energy of 25 KV to expose a portion 12 of each film as illustrated in FIG. 4B. The samples were developed at times ranging from one minute to sixty minutes in methyl isobutyl ketone (MIBK) at 21°C. At each stage of development the thickness of the remaining resist film was measured. The dissolution rates for various dosages are illustrated by the curves of FIG. 2 along with a development curve for an unexposed sample as a control. As shown in the graph, the exposed film dissolves at a rate, $S$, of 2,400A per minute at a dosage level of $50 \times 10^{-6}$ coulombs per square centimeter while the unexposed film dissolved at a rate, $S_0$, of 600A per minute. The net film thickness of developed resist is 25,000A minus 6,600A or 18,400A for a development time of 11 minutes. The sensitivity of the resist is defined as the ratio $S$ over $S_0$ for various doses. A minimum sensitivity for practical control is 2.0. In FIG. 3 a sensitivity curve is shown for a various increasing doses from 10 to $100 \times 10^{-6}$ coulombs per square centimeter. The dosage to obtain the required sensitivity of 2.0 then would be $20 \times 10^{-6}$ coulombs per square centimeter. A developed wafer was examined in cross section using a scanning electron microscope and a 6000× photograph was obtained. A slope resist profile of about 45° in the film was noted as illustrated in FIG. 4C. On top of resist layer 10 and the exposed portion of the substrate 11 was deposited by vacuum evaporation a 10,000A thick layer 13 of aluminum as illustrated in FIG. 4D. The aluminized film was dipped into warm acetone at 50°C in order to attempt to dissolve resist layer 10 and lift-off the portion of the aluminum layer which was not directly formed on the surface of wafer 11. The lift-off was not accomplished. This was apparently because the aluminum overcoated the sloped resist layer edge 14 so that the acetone could not attack and remove resist layer 10.

EXAMPLE 2

Figure 5B:
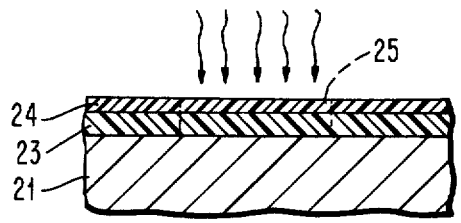
Figure 5D:
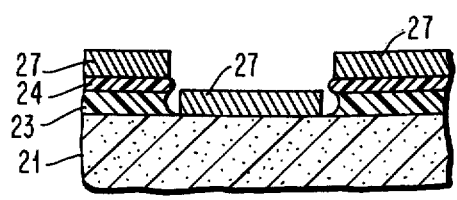
Figure 5E:
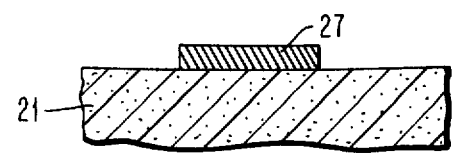

To contrast the results obtainable by the use of the process of the invention with that of the process illustrated in Example 1 a dual layer of polymethyl methacrylate was employed as described below. As illustrated in FIGS. 5A through E, onto wafer 21 was spin coated a 14,000A thick layer 23 of polymethyl methacrylate of the same molecular weight range employed in Example 1 from an 18% chlorobenzene solution. Layer 23 was prebaked at about 160°C for one hour. On top of layer 23 was formed a second layer 24 comprising a 7,000A thick film of polymethyl methacrylate of a higher molecular weight (Mw 750,450; Mn 246,190) from an 8% by weight solution of polymer in chlorobenzene. The dual layer film was prebaked for one hour at 160°C and then exposed to a scanning 1 micron beam of 25KV electrons at a dosage of $7.5 \times 10^{-6}$ coulombs per square centimeter. The exposure produced an exposed portion 25 in layers 23 and 24 as illustrated in FIG. 5B. The solubility rate, ($S_0$) of the unexposed top layer polymer was determined to be 75A per minute. The dual resist films were developed for about 50 minutes in methyl isobutyl ketone developer at a temperature of about 21°C. The unexposed portion of layer 24 lost about 3,750A during development. The net remaining dual film thickness then was determined to be 17,250A. The undercut developed resist profile illustrated in FIG. 5C was obtained as shown by a cross sectional, scanning electron microscope photograph of the developed resist layers at a magnification of 7,000×. The developed resist film was aluminized by vapor deposition with a 10,000A thick layer 27 of aluminum. The resist layers and overlying aluminum was lifted off as illustrated in FIGS. 5D and 5E by dissolution in warm acetone at 50°C. The resist thickness to metal thickness ratio was 1.7 to 1 and the image resolution of aluminum stripes was found to be a width to height ratio of about 1.3 to 1.0 (i.e., 13,000A width image 10,000A in height). The minimum spacing between aluminum stripes obtainable is about one half the net resist thickness or about 8,500A. It was found that the minimum dosage needed to obtain lift-off with a two layer process and a 10,000A thick aluminum layer was only one sixth the dosage needed for a single layer film.

EXAMPLE 3

As a further example of the process of the invention employing mixed polymer layers the following processes were conducted.

A. Single Polytertiary Butyl Methacrylate Layer

A 20,000A thick film of polytertiary butyl methacrylate (mw 104,000; Mn 52,500) was coated from a 15 percent by weight solution of polymer in chlorobenzene onto a silicon wafer. The film was prebaked at a temperature of about 160°C for about one hour. The film was exposed using a 1 micron beam of electrons at 25KV with doses from $1 \times 10^{-6}$ to $300 \times 10^{-6}$ c/cm². A sensitivity ratio $S/S_0$ of 4 to 1 was established at a dose of $25 \times 10^{-6}$ c/cm² for development in methyl isobutyl ketone at 21°C. The development rate $S_0$ was 1500A per minute for the exposed area S. After development, the remaining resist film thickness was 15,000A. The maximum thickness of aluminum that could be lifted off was 4500A using acetone at a temperature of about 40°C.

B. Dual Resist Film of Polymethyl Methacrylate Over Polytertiary Butyl Methacrylate A 15,000A thick film of polytertiary butyl methacrylate was spun coated onto a silicon wafer from a 15 percent by weight solution of polymer in chlorobenzene and prebaked at a temperature of about 160°C for about one hour. A second layer of the resist, polymethyl methacrylate (molecular weight Mw 750,450; Mn 246,190) having a thickness of about 3,000A was coated from a 5 percent by weight solution in chlorobenzene and the dual layer was dried at a temperature of about 160°C for about one hour. The resist layers were exposed using a 1 micron electron beam at an energy of 25KV at doses of from $1 \times 10^{-6}$ to $300 \times 10^{-6}$ coulombs per square centimeter. It was found that the dosage level of $7.5 \times 10^{-6}$ coulombs per square centimeter when developed for 20 minutes in methyl isobutyl ketone at 21°C gave a remaining film thickness of 16,500A. The film was aluminized by vapor deposition with a 10,000A thick layer of aluminum. The portion of the aluminum layer covering the remaining resist was successfully lifted off along with the resist layer by soaking in warm acetone at a temperature of about 40°C. The sensitivity of the resist, then was enhanced as illustrated by the reduction in dosage level required from $25 \times 10^{-6}$ coulombs per square centimeter to about 8 × 10⁻⁴ coulombs per square centimeter. The aspect ratio of resist layer thickness to metal layer thickness required to obtain successful lift-off was reduced from about 3 to about 1.6.

As shown above, the process of the invention gives a desirable profile which is undercut to aid in establishing the discontinuity between the portions of added layers which are attached to the resist and the portions of the layer which are directly attached to the substrate. This is obtained by the faster dissolution of the underlying resist layer in the developer. The process then need not rely upon the scatter of electrons phenomenon to obtain an undercut profile which is not obtainable with reasonable dosages when using the higher more penetrating electron beam energies.

As illustrated in the invention, the resist sensitivity is enhanced due to the fact that the development time required for the composite multilayer resist structure is roughly equal to the time to develop the upper layer. Due to the protection of the upper layer there is no thinning in thickness of the resist under layers during developing. In effect then, the sensitivity ratio $S/S_0$ is close to the ratio of the solubility rate S of the exposed lower molecular weight under layer and the solubility rate $S_0$ of the unexposed upper layer.

While the invention has been particularly shown and described with reference to preferred embodiments thereof, it will be understood by those skilled in the art that the foregoing and other changes, form and details may be made therein without departing from the spirit and scope of the invention.

We claim:

1. A high sensitivity resist layer structure comprising plural layers of resist coated on a substrate, each resist layer comprising a radiation degradable organic polymer with each successive resist layer being slower dissolving in resist developer than the resist layer it overlies both before and after exposure of said structure to said radiation.

2. A high sensitivity resist structure comprising:
   a substrate,
   a first layer of resist coated on said substrate said layer comprising a radiation degradable polymer, and
   a second layer of resist overlying said first layer, said second layer comprising a radiation degradable polymer which has a lower solubility rate in resist developer than the polymer of said first layer both before and after exposure of said structure to said radiation.

3. The structure of claim 2 wherein the polymer of said first layer is a lower alkyl ester of methacrylic acid and the polymer of said second layer is a lower alkyl ester of methacrylic acid.

4. The structure of claim 2 wherein the molecular weight of the polymer of said second layer is greater than the molecular weight of the polymer of said first layer whereby the solubility rate difference is achieved.

5. The structure of claim 3 wherein each layer is polymethyl methacrylate.

6. The structure of claim 5 wherein the polymethyl methacrylate in said first layer has a lower molecular weight then the polymethyl methacrylate of said second layer.

7. The structure of claim 5 wherein the majority of polymethyl methacrylate in said first layer is isotactic and the majority of polymethyl methacrylate in said second layer is syndiotactic.

8. A process for forming a resist mask comprising:
   coating on a substrate a first layer of resist, said layer comprising a radiation degradable polymer,
   coating on said first layer a second layer of resist said second layer comprising a radiation degradable polymer which is slower dissolving in resist developer than the polymer of said first layer both before and after exposure of both layers to said radiation,
   exposing portions of said layers to high energy radiation and developing to remove the exposed portions of said layers to uncover said substrate by treating said layers with a solvent which preferentially dissolves the exposed portions.

9. The process of claim 8 wherein the polymer of said first layer is a lower alkyl ester of methacrylic acid and the polymer of said second layer is a lower alkyl ester of methacrylic acid.

10. The process of claim 8 wherein the molecular weight of the polymer of said second layer is greater then the molecular weight of the polymer of said first layer whereby the solubility rate difference is achieved.

11. The process of claim 9 wherein each layer is polymethyl methacrylate.

12. The process of claim 11 wherein the polymethyl methacrylate in said first layer has a lower molecular weight then the polymethyl methacrylate polymer of said second layer.

13. The process of claim 11 wherein the majority of the polymethyl methacrylate polymer in said first layer is isotactic and the majority of polymethyl methacrylate in said second layer is syndiotactic.

14. The process of claim 8 wherein the exposure radiation is electron beam radiation having an energy of from about 3 to 50KV.

15. The process of claim 8 including the steps of coating the developed resist layers and substrate with a layer of material having a thickness such that the portions of said layer of material directly overlying said substrate are not connected to the portions of said layer of material covering said resist layers, and stripping said resist layers and overlying portions of material such that only the portions of material formed directly on the substrate remain.

16. The process of claim 8 wherein said first layer has a thickness of from about 1,000A to about 100,000A and said second layer has a thickness of from about 200A to about 20,000A.

17. The process of claim 16 wherein the polymer in said first layer has a number average molecular weight of from about 500 to about 100,000 and the polymer in said second layer has a number average molecular weight of from about 20,000 to about 10,000,000.

* * * * *